US007137179B2

(12) United States Patent
Yokouchi et al.

(10) Patent No.: US 7,137,179 B2
(45) Date of Patent: Nov. 21, 2006

(54) METHOD OF FORMING A PIEZOELECTRIC LAYER IN FORMING A PIEZOELECTRIC ELEMENT INCLUDING A LOWER ELECTRODE ON ONE SURFACE OF A SUBSTRATE

(75) Inventors: Toshiaki Yokouchi, Nagano-ken (JP); Koji Sumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 166 days.

(21) Appl. No.: 10/883,035

(22) Filed: Jul. 2, 2004

(65) Prior Publication Data

US 2005/0109456 A1    May 26, 2005

(30) Foreign Application Priority Data

Jul. 3, 2003    (JP)    ............................. 2003-191247

(51) Int. Cl.
H04R 17/00    (2006.01)
B05D 5/12    (2006.01)
H01L 41/04    (2006.01)

(52) U.S. Cl. ..................... 29/25.35; 29/831; 29/832; 29/890.1; 427/100; 310/311

(58) Field of Classification Search ............... 29/25.35, 29/890.1, 831, 832; 427/100, 226, 314, 380, 427/318, 319, 379, 376.2; 347/68–71; 310/328, 310/311
See application file for complete search history.

(56) References Cited

U.S. PATENT DOCUMENTS 6,140,746 A * 10/2000 Miyashita et al. .......... 310/358

6,328,433 B1 * 12/2001 Moriya et al. ................ 347/68
6,387,225 B1 *  5/2002 Shimada et al. ....... 204/192.18
6,499,837 B1 * 12/2002 Murai ......................... 347/71

FOREIGN PATENT DOCUMENTS

JP    6-181173 A    6/1994

\* cited by examiner

*Primary Examiner*—A. Dexter Tugbang
*Assistant Examiner*—Tai Van Nguyen
(74) *Attorney, Agent, or Firm*—Sterne, Kessler, Goldstein & Fox P.L.L.C.

(57) ABSTRACT

A method of forming a piezoelectric layer includes: a drying step for forming at least one ferroelectric precursor film on a lower electrode of a substrate and drying the ferroelectric precursor film; a degreasing step for carrying the substrate into a region facing a hot plate heated to a certain temperature and for degreasing the ferroelectric precursor film in a state where the substrate is supported by a proximity pin; and a baking step for further baking the degreased ferroelectric precursor film to form the degreased ferroelectric precursor film into a ferroelectric film. The piezoelectric layer is formed by repeating the drying, degreasing, and baking steps for the ferroelectric precursor film in a predetermined number of cycles. The degreasing step includes a step of adjusting a heating temperature of the ferroelectric precursor film by adjusting a distance between the hot plate and the substrate and by lowering a temperature of space on an opposite side of the substrate from the hot plate.

5 Claims, 8 Drawing Sheets

METHOD OF FORMING A PIEZOELECTRIC LAYER IN FORMING A PIEZOELECTRIC ELEMENT INCLUDING A LOWER ELECTRODE ON ONE SURFACE OF A SUBSTRATE

BACKGROUND OF THE INVENTION

1. Field of the Invention

The present invention relates to a method of forming a piezoelectric layer which includes a ferroelectric film and which constitutes a piezoelectric element, and relates to a piezoelectric layer and a piezoelectric element. Further, the present invention relates to a heating apparatus used in degreasing a ferroelectric precursor film, which becomes a piezoelectric layer.

2. Description of the Related Art

Piezoelectric elements having piezoelectric layers made of ferroelectric films have spontaneous polarization, high dielectric constants, electrooptical effect, piezoelectric effect, pyroelectric effect, and the like. Accordingly, piezoelectric elements are applied to a wide range of devices, e.g., an ink jet recording head and the like. The ferroelectric film (piezoelectric layer) constituting such a piezoelectric element is formed by, for example, the sol-gel method. That is, a ferroelectric precursor film is formed by applying, for example, a sol of an organometallic compound to the top of a predetermined substrate, and the ferroelectric precursor film is heated to a predetermined temperature to be dried and degreased and is then baked at a higher temperature to be crystallized, thus obtaining the ferroelectric film.

Here, when the ferroelectric precursor film is degreased, the ferroelectric precursor film needs to be heated to a predetermined temperature. As a heating apparatus used in this case, for example, there is one in which a substrate is supported by proximity pins placed at a position facing a hot plate to be vertically movable and in which a heating temperature of the substrate is adjusted by lowering the proximity pins and thus adjusting the distance between the substrate and the hot plate (e.g., refer to Japanese Unexamined Patent Publication No. Hei 6(1994)-181173).

However, when the ferroelectric precursor film is degreased by use of such a heating apparatus, the ferroelectric precursor film may not be sufficiently degreased. That is, since the heating apparatus is placed, for example, inside a housing or the like for safety and the like, a temperature of the entire inside of the housing increases when the hot plate is heated. This causes a problem in which a coating is formed on the surface of the ferroelectric precursor film and in which the entire ferroelectric precursor film cannot be sufficiently degreased.

Moreover, if degreasing is performed by use of such a heating apparatus, there is a problem in which it is difficult for crystal nuclei to be formed in the ferroelectric precursor film and in which the ferroelectric precursor film is not favorably crystallized even when the ferroelectric precursor film is baked. This may be because a temperature of the ferroelectric precursor film sharply increases.

SUMMARY OF THE INVENTION

In light of the above-described circumstances, an object of the present invention is to provide a method of forming a piezoelectric layer in which a ferroelectric precursor film can be reliably degreased to obtain favorable crystallinity, and to provide a heating apparatus used in the same, a piezoelectric layer having favorable crystallinity, and a piezoelectric element.

In order to achieve the above-described object, a first aspect of the present invention is a method of forming a piezoelectric layer in forming a piezoelectric element including a lower electrode placed on one surface of a substrate, the piezoelectric layer placed on the lower electrode and made of a plurality of ferroelectric films, and an upper electrode placed on the piezoelectric layer. This method includes: a drying step for forming at least one ferroelectric precursor film on the lower electrode of the substrate and drying the ferroelectric precursor film; a degreasing step for carrying the substrate into a region facing a hot plate heated to a certain temperature and for degreasing the ferroelectric precursor film in a state where the substrate is supported by a proximity pin; and a baking step for further baking the degreased ferroelectric precursor film to form the degreased ferroelectric precursor film into the ferroelectric film. The piezoelectric layer is formed by repeating the drying, degreasing, and baking steps for the ferroelectric precursor film in a predetermined number of cycles. The degreasing step includes the step of adjusting a heating temperature of the ferroelectric precursor film by adjusting a distance between the hot plate and the substrate and by lowering a temperature of space on an opposite side of the substrate from the hot plate.

In the above-described first aspect, the ferroelectric precursor film can be heated at an optimum heating temperature. Further, cooling the space prevents a coating from being formed on the surface of the ferroelectric precursor film. Accordingly, the entire ferroelectric precursor film is favorably degreased.

A second aspect of the present invention is the method of forming the piezoelectric layer of the first aspect in which the degreasing step for a first cycle includes: a first step for degreasing the ferroelectric precursor film in a state where a predetermined distance is maintained between the substrate and the hot plate; and a second step for degreasing the ferroelectric precursor film in a state where the substrate is in contact with the hot plate.

In the above-described second aspect, the ferroelectric precursor film is heated at an optimum temperature-rising rate in degreasing. Accordingly, the entire ferroelectric precursor film is favorably degreased, and a large number of crystal nuclei are favorably formed.

A third aspect of the present invention is the method of forming the piezoelectric layer of the first or second aspects in which the temperature of the space is lowered by generating air flow in a vicinity of a surface of the substrate.

In the above-described third aspect, the temperature of the space can be relatively easily and sufficiently lowered.

A fourth aspect of the present invention is the method of forming the piezoelectric layer of any one of the first to third aspects in which the temperature of the space is lowered to 200° C. or less.

In the above-described fourth aspect, a coating can be reliably prevented from being formed on the surface of the ferroelectric precursor film, and the ferroelectric precursor film is favorably degreased.

A fifth aspect of the present invention is the method of forming the piezoelectric layer of the fourth aspect in which the hot plate is heated to 300° C. to 500° C.

In the above-described fifth aspect, the ferroelectric precursor film can be favorably degreased.

A sixth aspect of the present invention is the piezoelectric layer formed by the method of any one of the first to fifth aspects.

In the above-described sixth aspect, the crystallinity of the piezoelectric layer is improved.

A seventh aspect of the present invention is the piezoelectric element including the piezoelectric layer of the sixth aspect.

In the above-described seventh aspect, the crystallinity of the piezoelectric layer is improved, and various kinds of characteristics of the piezoelectric element, such as displacement characteristics, are improved.

An eighth aspect of the present invention is a heating apparatus including: a hot plate heated to a certain temperature; a proximity pin for supporting a predetermined substrate in a region facing the hot plate, the proximity pin being provided to be vertically movable; and cooling means for lowering at least a temperature of space on an opposite side of the substrate from the hot plate to a predetermined temperature or less, the predetermined temperature being lower than a temperature on a hot plate side of the substrate.

In the above-described eighth aspect, the ferroelectric precursor film can be heated at an optimum heating temperature. Further, cooling the space makes it possible to prevent a coating from being formed on the surface of the ferroelectric precursor film. Accordingly, the ferroelectric precursor film is favorably degreased.

A ninth aspect of the present invention is the heating apparatus of the eighth aspect in which the cooling means is air flow generating means for generating air flow in at least a vicinity of a surface of the substrate which is opposite to the hot plate.

In the above-described ninth aspect, the temperature of the space can be relatively easily and sufficiently lowered. Accordingly, the temperature of the entire surface of the substrate can be easily maintained at a certain temperature or less.

A tenth aspect of the present invention is the heating apparatus of the eighth or ninth aspect in which the cooling means lowers the temperature of the space to 200° C. or less.

In the above-described tenth aspect, the coating can be reliably prevented from being formed on the surface of the ferroelectric precursor film, and the ferroelectric precursor film is favorably degreased.

An eleventh aspect of the present invention is the heating apparatus of the tenth aspect in which a heating temperature of the hot plate is 300° C. to 500° C.

In the above-described eleventh aspect, the ferroelectric precursor film can be favorably degreased.

DESCRIPTION OF THE PREFERRED EMBODIMENT

Hereinafter, the present invention will be described in detail based on an embodiment.

Figure 1:
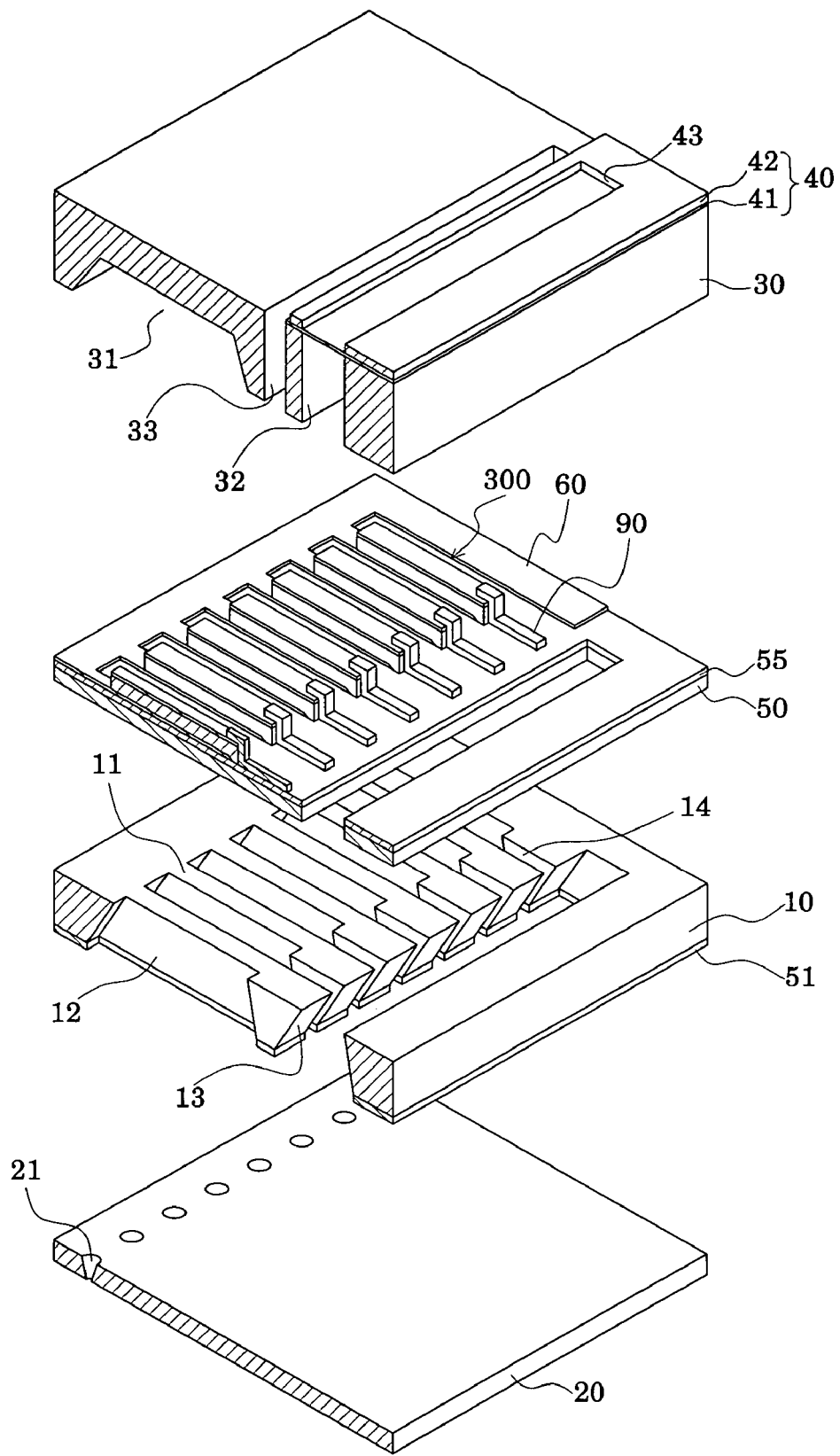
FIG. 1 is an exploded perspective view of a recording head according to an embodiment.
Figure 2A:
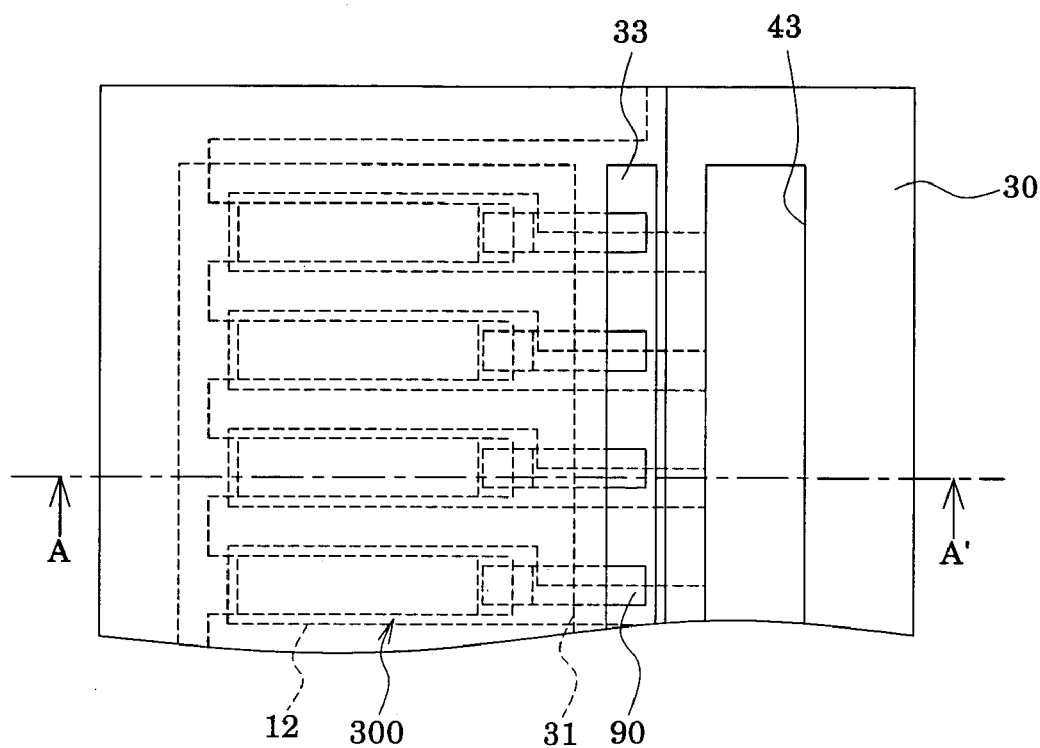
FIGS. 2A and 2B are a plan view and a cross-sectional view of the recording head according to the embodiment.
Figure 2B:
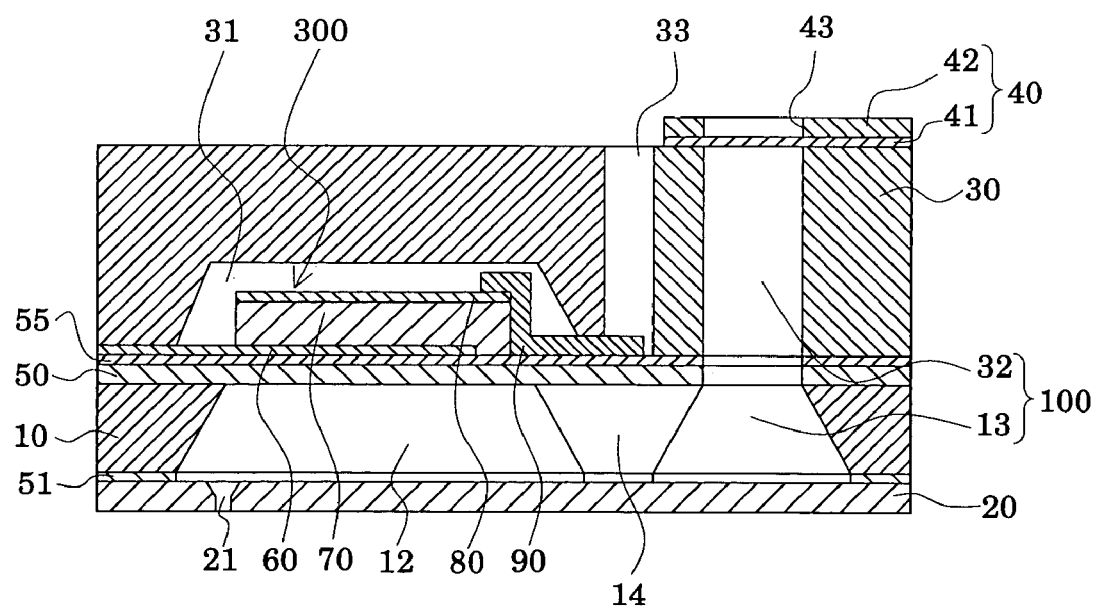

FIG. 1 is an exploded perspective view of an ink jet recording head having a piezoelectric element according to an embodiment of the present invention. FIGS. 2A and 2B are a plan view and a cross-sectional view of FIG. 1. As shown in these drawings, in this embodiment, a passage-forming substrate 10 is made of a single crystal silicon substrate with (110) plane orientation. In one surface of the passage-forming substrate 10, a plurality of pressure generating chambers 12, which are formed by anisotropic etching and sectioned by compartment walls 11, are arranged in a row in the width direction of the pressure generating chambers. Moreover, in the outside of the pressure generating chambers 12 in the longitudinal direction thereof, communicating portions 13, which communicate with a reservoir portion of a sealing plate (to be described later) to constitute part of a reservoir, are formed. Each communicating portion 13 is made to communicate respectively with one end of each pressure generating chamber 12 in the longitudinal direction through each ink supply path 14. Further, the one surface of the passage-forming substrate 10 is an opening surface. On the other surface, an elastic film 50, which is previously formed by thermal oxidation and made of silicon dioxide and has a thickness of 1 to 2 µm, is formed.

Moreover, a nozzle plate 20 is fixed to the opening surface of the passage-forming substrate 10 with an adhesive agent, a thermowelding film, or the like interposed therebetween. The nozzle plate 20 is provided with nozzle orifices 21, each of which communicates with the opposite end of each pressure generating chamber 12 from the ink supply path 14.

Meanwhile, on the opposite surface of the above-described passage-forming substrate 10 from the opening surface, the elastic film 50 having a thickness of, for example, approximately 1.0 µm is formed as described previously. On the elastic film 50, an insulation film 55 having a thickness of, for example, approximately 0.4 µm is formed. Further, on the insulation film 55, a lower electrode film 60 having a thickness of, for example, approximately 0.2 µm, piezoelectric layers 70 having thicknesses of, for example, approximately 1.0 µm, and upper electrode films 80 having thicknesses of, for example, approximately 0.05 µm are formed and stacked by a process to be described later, and constitute piezoelectric elements 300. Here, the piezoelectric element 300 means a portion including the lower electrode film 60, the piezoelectric layer 70, and the upper electrode film 80. In general, one of the electrodes of each piezoelectric element 300 is formed as a common electrode, and the other electrode and the piezoelectric layer 70 are formed by patterning for each respective pressure generating chamber 12. Moreover, here, a portion which is constituted by one electrode and the piezoelectric layer 70 formed by patterning and in which piezoelectric strain occurs due to application of a voltage to both electrodes, is referred to as a piezoelectric active portion. In this embodiment, the lower electrode film 60 is formed as a common electrode of the piezoelectric elements 300, and the upper electrode films 80 are formed as individual electrodes of the piezoelectric elements 300. However, there is no harm in reversing this depending on a driving circuit or wiring. In both cases, the piezoelectric active portion is formed for each pressure generating chamber 12. Moreover, here, the piezoelectric element 300 and a vibration plate in which displacement occurs by driving the piezoelectric element 300 are collectively referred to as a piezoelectric actuator. Note that, in this embodiment, the elastic film 50, the insulation film 55, and the lower electrode film 60 function as the vibration plate.

Here, a lead electrode 90 is connected to each upper electrode film 80, which is each of the individual electrodes of the piezoelectric elements 300. The lead electrode 90 is made of, for example, gold (Au) or the like, and extends from the vicinity of the end of the upper electrode film 80 on the ink supply path 14 side to the outside of the pressure generating chamber 12. Further, though not shown, an external interconnection linked to a driving circuit for driving the piezoelectric elements 300 is connected to the vicinity of the tip of the lead electrode 90.

Moreover, a sealing plate 30 is joined to the top of the passage-forming substrate 10, on which the above-described piezoelectric elements 300 are formed. The sealing plate 30 has a piezoelectric element holding portion 31 capable of ensuring, in a region facing the piezoelectric elements 300, a space enough for not inhibiting movement of the piezoelectric elements 300 and sealing the space in this state. Material used for the sealing plate 30 is preferably a material having approximately the same linear expansion coefficient as the passage-forming substrate 10, e.g., a single crystal silicon substrate. Further, a reservoir portion 32, which constitutes at least part of a reservoir 100 to be a common ink chamber of each pressure generating chamber 12, is provided in the sealing plate 30. Moreover, a penetrated hole 33, which penetrates the sealing plate 30 in the thickness direction thereof, is provided in a region between the piezoelectric element holding portion 31 and the reservoir portion 32 of the sealing plate 30. In addition, the vicinities of the ends of the lead electrodes 90, which are led from the respective piezoelectric elements 300, are exposed in the penetrated hole 33. Furthermore, a compliance plate 40, which is made of a sealing film 41 formed of a flexible material with low rigidity and a fixing plate 42 formed of a hard material, such as metal, is joined to the top of the sealing plate 30. Incidentally, a region of the fixing plate 42 which faces the reservoir 100 is an opening portion 43 in which the fixing plate 42 is completely removed in the thickness direction thereof, and therefore one surface of the reservoir 100 is sealed with only the sealing film 41.

In the ink jet recording head of this embodiment as described above, ink is supplied from external ink supply means (not shown), and the inside from the reservoir 100 to the nozzle orifices 21 is filled with the ink. Thereafter, voltages are applied between the respective lower and upper electrode films 60 and 80 corresponding to the pressure generating chambers 12 through the external interconnection in accordance with a record signal from a driving circuit (not shown), thereby flexibly deforming the elastic film 50, the insulation film 55, the lower electrode film 60, and the piezoelectric layers 70. Thus, pressures in the respective pressure generating chambers 12 are increased, and ink droplets are ejected from the nozzle orifices 21.

Figure 3A:
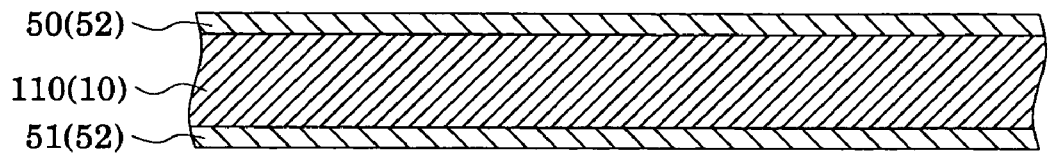
FIGS. 3A to 3D are cross-sectional views showing a process of manufacturing the recording head according to the embodiment.
Figure 3B:
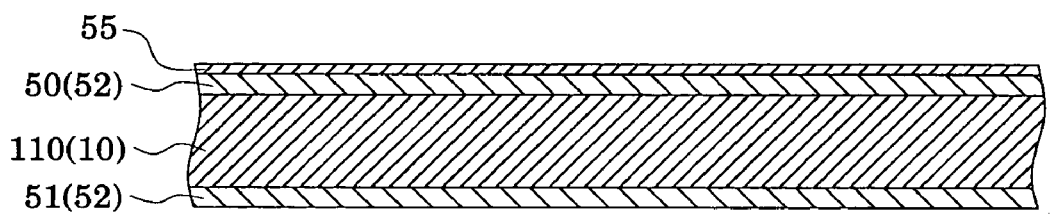
Figure 3C:
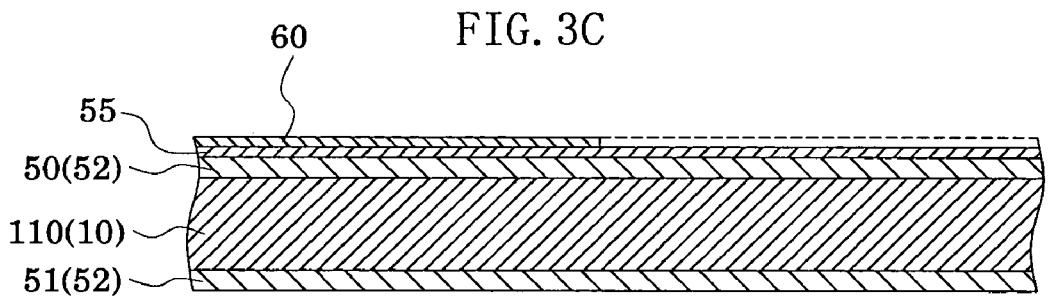

Hereinafter, a method of manufacturing the ink jet recording head according to this embodiment described above will be described with reference to FIGS. 3A to 6C. First, as shown in FIG. 3A, a silicon wafer 110, which becomes the passage-forming substrate 10, is thermally oxidized in a diffusion furnace at approximately 1100° C., thus forming the elastic film 50 and a silicon dioxide film 52, which becomes a mask film 51, on the entire surface. Next, as shown in FIG. 3B, a zirconium (Zr) layer is formed on the elastic film 50 (silicon dioxide film 52) and then thermally oxidized in the diffusion furnace at, for example, 500 to 1200° C., thus forming the insulation film 55 made of zirconium oxide ($ZrO_2$). Subsequently, as shown in FIG. 3C, the lower electrode film 60 made of, for example, platinum and iridium is formed on the insulation film 55 and patterned into a predetermined shape. Platinum, iridium, and the like are suitable as material for the lower electrode film 60. This is because the piezoelectric layer 70 (to be described later) to be deposited by sputtering or the sol-gel method needs to be baked and crystallized at a temperature of approximately 600 to 1000° C. in an ambient atmosphere or in an oxygen atmosphere after deposition. That is, material for the lower electrode film 60 must maintain conductivity in such a high-temperature oxygen atmosphere. In the case where lead zirconate titanate (PZT) is used for the piezoelectric layer 70 as in this embodiment, the change in the conductivity due to the diffusion of lead oxide is desired to be small. For these reasons, platinum, iridium, and the like are suitable.

Figure 3D:
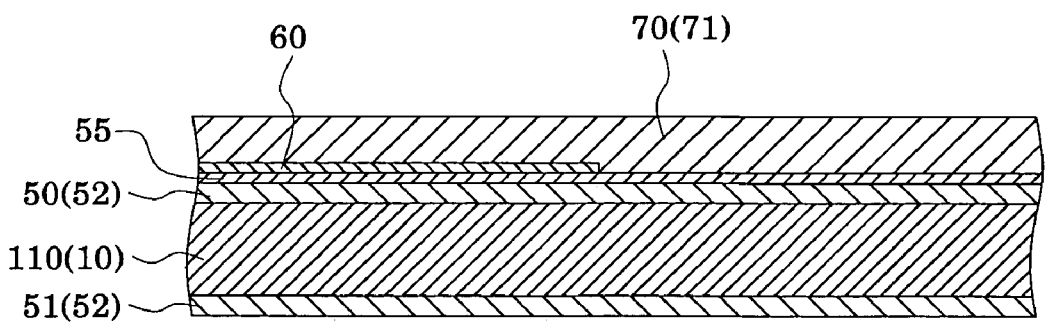

Next, as shown in FIG. 3D, the piezoelectric layer 70 is formed on the lower electrode film 60. As described previously, the piezoelectric layer 70 is formed by stacking a plurality of ferroelectric films 71. In this embodiment, these ferroelectric films 71 are formed by the so-called sol-gel method. That is, metal-organic matter is dissolved and dispersed in catalyst, and the resultant sol is applied and dried to be gelled, thus forming a ferroelectric precursor film. Further, the ferroelectric precursor film is degreased, thus removing organic constituents. Thereafter, the degreased ferroelectric precursor film is baked to be crystallized, thereby forming the ferroelectric film 71.

Figure 4A:
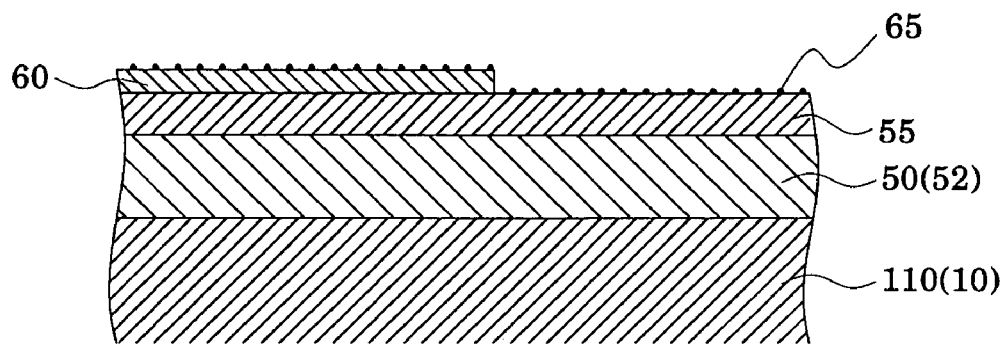
FIGS. 4A to 4C are cross-sectional views showing the process of manufacturing the recording head according to the embodiment.
Figure 4B:
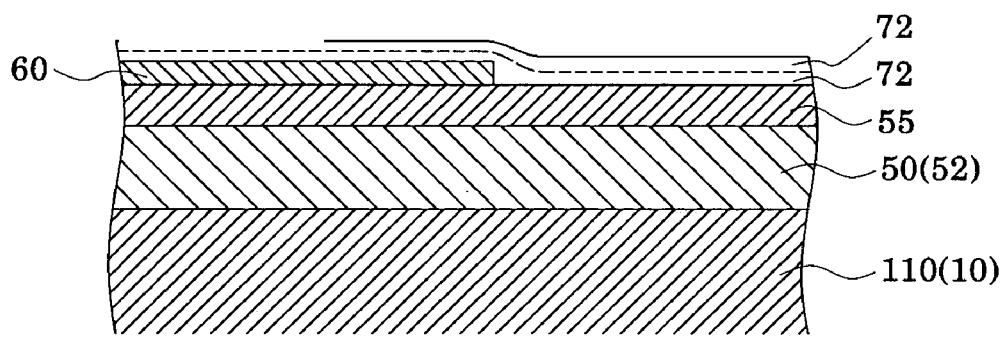

Specifically, first, as shown in FIG. 4A, a crystal seed (layer) 65 made of titanium or titanium oxide is formed by sputtering on the entire surface of the silicon wafer 110 including the surface of the lower electrode film 60. Subsequently, as shown in FIG. 4B, an uncrystallized ferroelectric precursor film 72 is formed to have a predetermined thickness (a thickness of approximately 0.2 μm in this embodiment) by a coating method, e.g., spin coating or the like (deposition step). Incidentally, the thickness of the ferroelectric precursor film 72 formed by one coating operation is approximately 0.1 μm. Accordingly, in this embodiment, the ferroelectric precursor film 72 having a thickness of approximately 0.2 μm is formed by two coating operations.

Subsequently, the ferroelectric precursor film 72 is dried at a predetermined temperature for a predetermined time (drying step). The temperature at which the ferroelectric precursor film 72 is dried is preferably, for example, 150° C. to 200° C. Approximately 180° C. is suitable. Further, the time for which the ferroelectric precursor film 72 is dried is preferably, for example, 5 minutes to 15 minutes. Approximately 10 minutes is suitable.

Next, the silicon wafer 110 is heated by a heating apparatus to be described later, thereby degreasing the ferroelectric precursor film 72 for a predetermined time, e.g., approximately 10 to 15 minutes (degreasing step). Incidentally, degreasing here means to remove organic constituents of the ferroelectric precursor film. The heating temperature of the silicon wafer 110 in such a degreasing step is preferably within a range of 300° C. to 500° C. for the following reason: if the temperature is too high, the crystallization of the ferroelectric precursor film 72 starts; and if the temperature is too low, sufficient degreasing cannot be performed.

Moreover, even in the case where the silicon wafer 110 is heated to such a temperature, it is desirable to control the temperature of the space on the ferroelectric precursor film 72 side to 200° C. or less. This prevents a coating of remaining carbon from being formed on the surface of the ferroelectric precursor film 72, and organic constituents are reliably removed from the ferroelectric precursor film 72 by the degreasing step.

Figure 5:
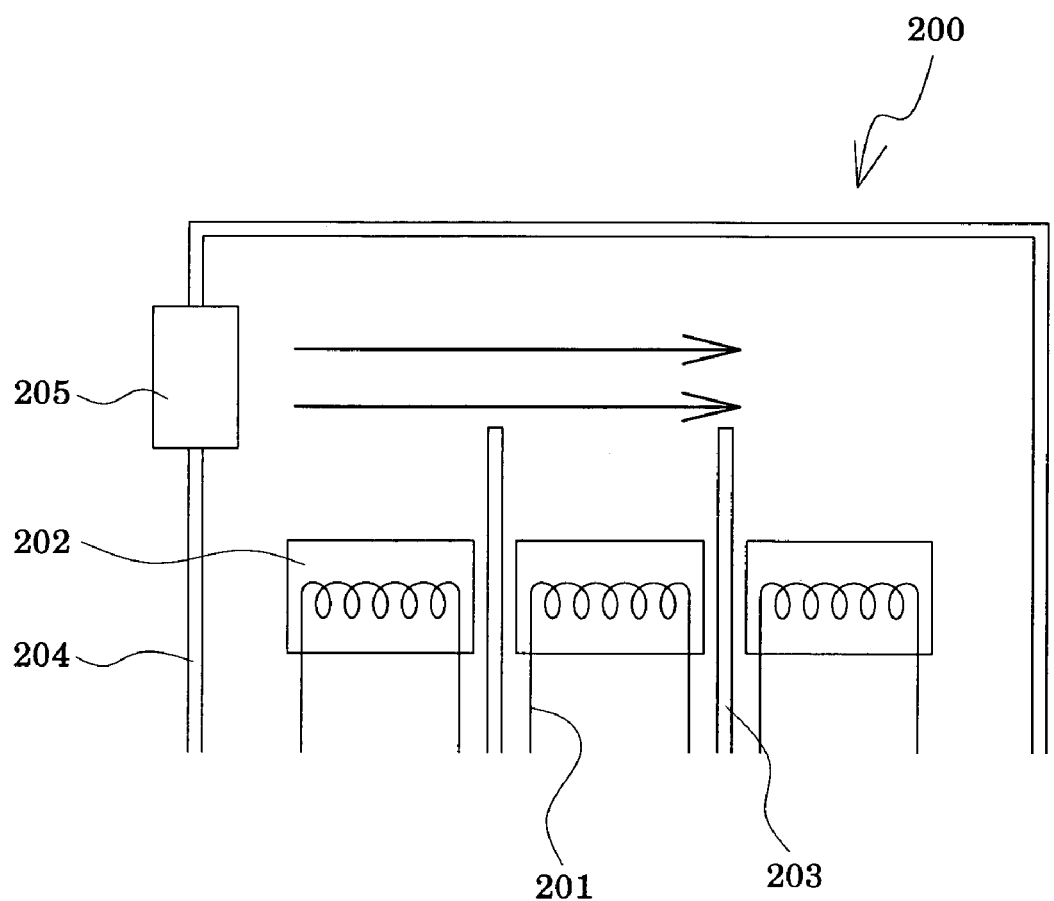
FIG. 5 is a schematic diagram of a heating apparatus according to the embodiment.

In order to realize such temperature control, the heating apparatus described below is used in this invention. As shown in FIG. 5, the heating apparatus 200 according to the present invention has a hot plate 202 and a plurality of proximity pins 203. The hot plate 202 has a heater 201 inside. The proximity pins 203 support the silicon wafer 110 in a region facing the hot plate 202. The hot plate 202 and the proximity pins 203 are placed in a housing 204. Moreover, cooling means (in this embodiment, a fan 205 for allowing outside air to flow into the housing 204) for lowering the temperature of the space on the opposite side of the silicon wafer 110 from the hot plate 202, is provided in the housing 204. Thus, in the degreasing step, the distance between the hot plate 202 and the silicon wafer 110 is adjusted, and the temperature of the space on the opposite side of the silicon wafer 110 from the hot plate 202 is lowered, thereby adjusting the heating temperature of the ferroelectric precursor film 72.

Moreover, in this embodiment, in the degreasing step in which the above-described heating apparatus 200 is used, crystal nuclei are simultaneously grown in the ferroelectric precursor film 72. Accordingly, the degreasing step preferably has a first degreasing step for degreasing the ferroelectric precursor film 72 by heating the silicon wafer 110 in the state where a predetermined distance is maintained between the silicon wafer 110 and the hot plate 202, and a second degreasing step for degreasing the ferroelectric precursor film 72 by heating the silicon wafer 110 in the state where the silicon wafer 110 is in contact with the hot plate 202.

Figure 6A:
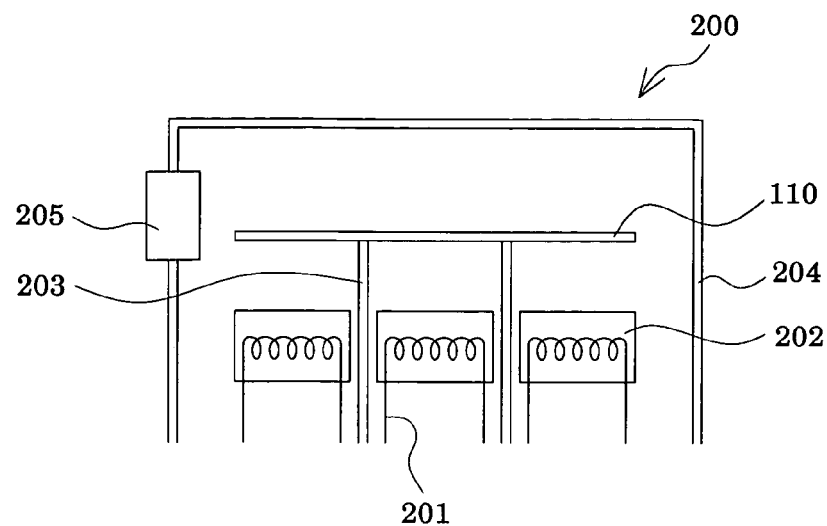
FIGS. 6A to 6C are schematic diagrams showing the process of manufacturing the recording head according to the embodiment.
Figure 6B:
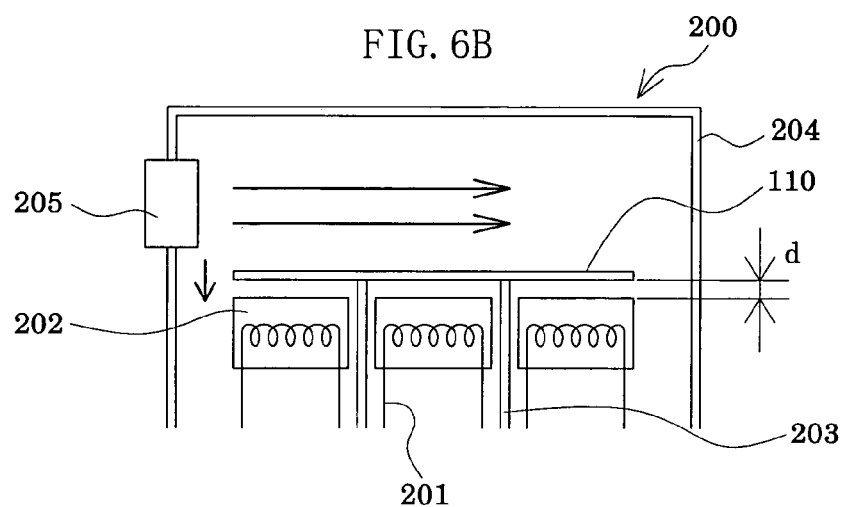

Specifically, first, as shown in FIG. 6A, in the state where the hot plate 202 is heated to a predetermined temperature (400° C. in this embodiment), the silicon wafer 110 is carried into a region facing the hot plate 202 by, for example, a robot arm or the like, and the silicon wafer 110 is supported by the proximity pins 203. Then, as shown in FIG. 6B, the proximity pins 203 are lowered to be stopped at the position where the distance between the hot plate 202 and the silicon wafer 110 becomes a predetermined distance d. In this state, the silicon wafer 110 is heated by use of the radiation heat of the hot plate 202, thus degreasing the ferroelectric precursor film 72 for a certain time, e.g., approximately five minutes (first degreasing step). Thus, the ferroelectric precursor film 72 on the silicon wafer 110 is heated to approximately 380° C. at a predetermined temperature-rising rate, whereby organic constituents are removed from the ferroelectric precursor film 72 and a large number of crystal nuclei are formed.

Figure 7:
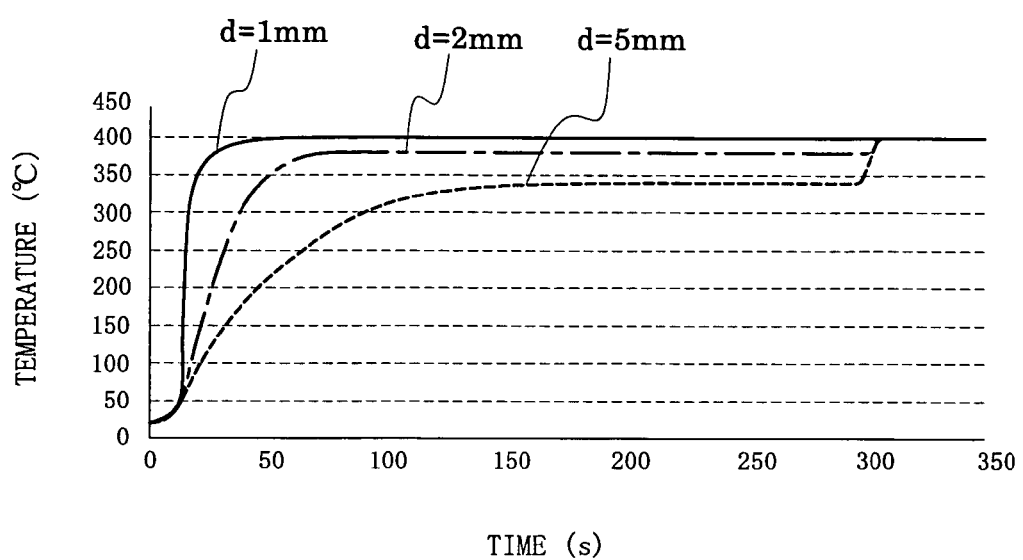
FIG. 7 is a graph showing increase in a temperature of a silicon wafer during degreasing.

Here, in order to favorably form crystal nuclei in the ferroelectric precursor film 72 in the first degreasing step, the temperature of the ferroelectric precursor film 72 is preferably raised at a relatively low temperature-rising rate. For example, it is desirable that the temperature-rising rate when the temperature rises from 250° C. to 300° C. is approximately 1.5 to 2° C./second. For example, in the case of the ferroelectric precursor of this embodiment, as shown in FIG. 7, a desired temperature-rising rate was obtained by setting the predetermined distance d between the silicon wafer 110 and the hot plate 202 at approximately 2 mm. Incidentally, if the distance d is set at approximately 1 mm, the temperature-rising rate of the temperature of the ferroelectric precursor film 72 becomes too high. On the other hand, if the distance d is set at approximately 5 mm, the temperature-rising rate becomes too low. In both cases, crystal nuclei are hard to form. For such a reason, the distance d between the silicon wafer 110 and the hot plate 202 is preferably set at 2 mm.

Note that the distance d between the silicon wafer 110 and the hot plate 202 in the first degreasing step should be appropriately determined depending on the constituents and the like of the ferroelectric precursor film 72 so as to obtain a desired temperature-rising rate.

Figure 6C:
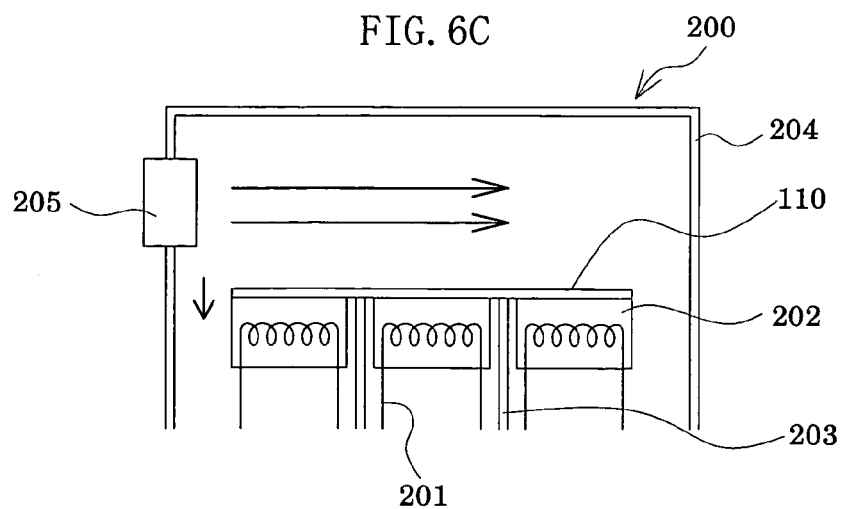

Then, after crystal nuclei have been formed in the ferroelectric precursor film 72, the proximity pins 203 are further lowered as shown in FIG. 6C, and the silicon wafer 110 is heated to 400° C. in the state where the silicon wafer 110 is in contact with the hot plate 202, thus degreasing the ferroelectric precursor film 72 for several tens of seconds (second degreasing step). Moreover, in this embodiment, in the degreasing step, the fan 205 of the heating apparatus 200 is always operated, and air flow is generated in the space in the vicinity of the surface of the silicon wafer 110 to cool the surface of the silicon wafer 110. Accordingly, regardless of the distance between the silicon wafer 110 and the hot plate 202, the temperature of the surface of the ferroelectric precursor film 72 is always controlled to 200° C. or less.

By degreasing the ferroelectric precursor film 72 as described above, crystal nuclei can be favorably formed while the ferroelectric precursor film 72 is degreased in the first degreasing step, and furthermore, degreasing speed is accelerated in the second degreasing step. Accordingly, the time for degreasing the ferroelectric precursor film 72 can be shortened, and working efficiency is improved. Moreover, in the degreasing step, the temperature of the space in the vicinity of the surface of the silicon wafer 110 is always controlled to 200° C. or less. Accordingly, even if the heating temperature of the ferroelectric precursor film 72 by the hot plate 202 is set relatively high, the ferroelectric precursor film 72 can be favorably degreased.

Figure 4C:
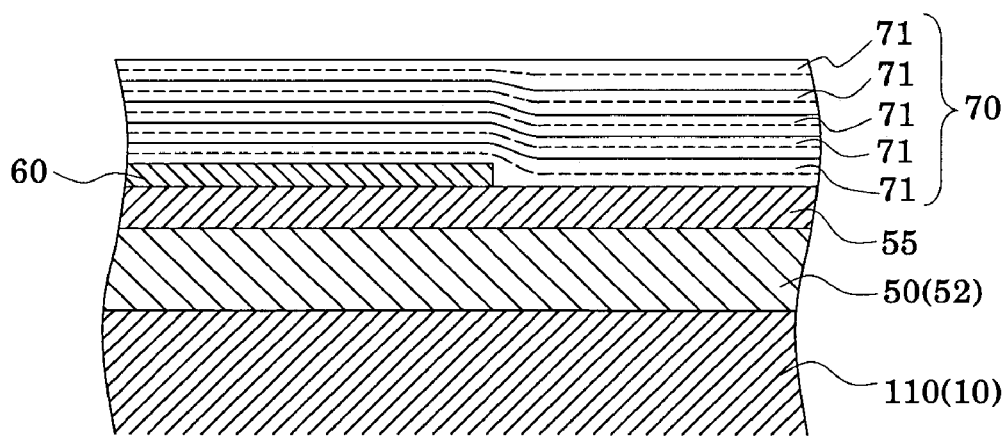

Incidentally, after the above-described degreasing step has finished, the silicon wafer 110 is heated to approximately 700° C. in the diffusion furnace or the like, thereby baking and crystallizing the ferroelectric precursor film 72 to form the ferroelectric film 71 of a first layer (baking step). Then, the above-described deposition step, drying step, degreasing step, and baking step are repeated in a plurality of cycles (five cycles in this embodiment) to form a plurality of ferroelectric films 71, thus forming the piezoelectric layer 70 having a total thickness of approximately 1 μm (FIG. 4C).

Moreover, the aforementioned degreasing step, i.e., the degreasing step for forming the ferroelectric film 71 of the first layer, preferably has the first and second degreasing steps. However, in each of degreasing steps for forming ferroelectric films 71 of second and subsequent layers, it is sufficient to heat the silicon wafer to degrease the ferroelectric precursor film in the state where the silicon wafer is in contact with the hot plate from the beginning. This is because, in each of the ferroelectric films 71 of the second and subsequent layers, crystals grow using as nuclei the crystals in the ferroelectric film 71 of the first layer and therefore there is no need to additionally form crystal nuclei.

Figure 8A:
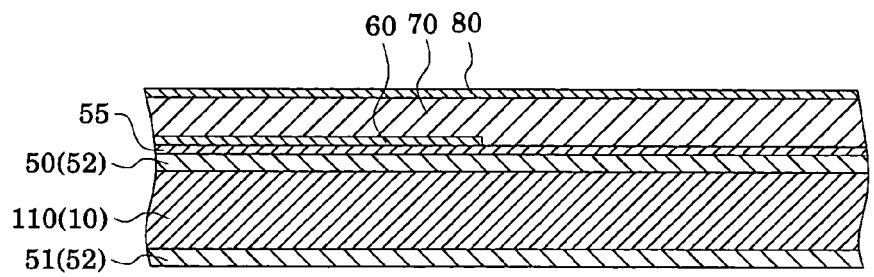
FIGS. 8A to 8D are cross-sectional views showing the process of manufacturing the recording head according to the embodiment.
Figure 8B:
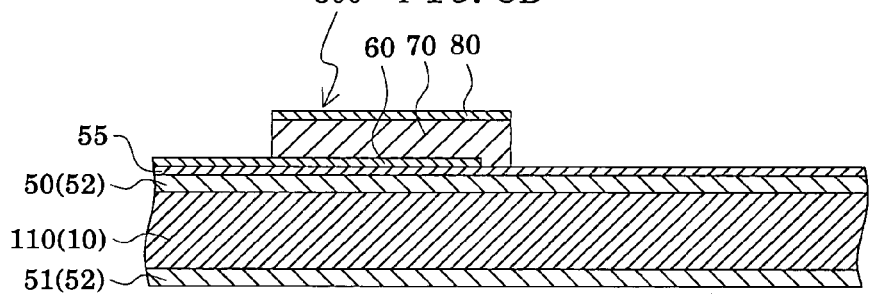
Figure 8C:
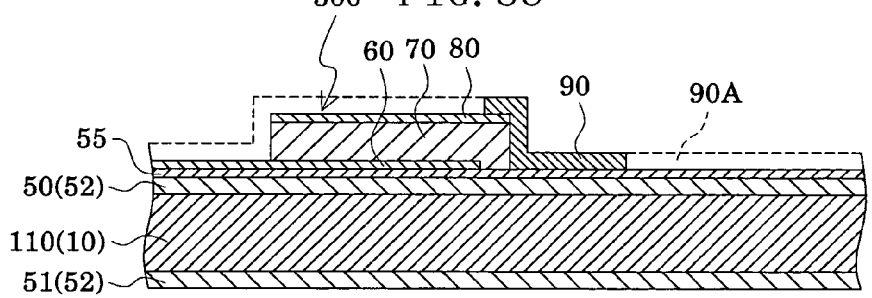

Thereafter, as shown in FIG. 8A, an upper electrode film 80 is deposited. The upper electrode film 80 may be made of any highly conductive material. Many metals including iridium, aluminum, gold, nickel, and platinum, conductive oxides, and the like can be used. In this embodiment, platinum is deposited by sputtering. Next, as shown in FIG. 8B, the piezoelectric elements 300 are patterned by etching only the piezoelectric layer 70 and the upper electrode film 80. Subsequently, as shown in FIG. 8C, the lead electrodes 90 are formed. For example, in this embodiment, a metal film 90A made of gold (Au) or the like is formed over the entire surface of the silicon wafer 110, and then the metal film 90A is patterned for the respective piezoelectric elements 300, thereby forming the respective lead electrodes 90.

Figure 8D:
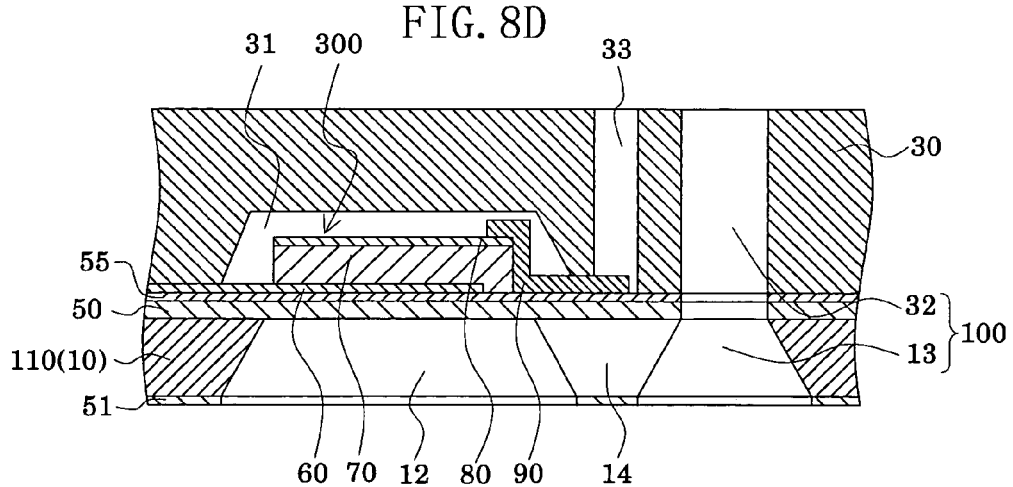

The above is the process of forming films. After the films have been formed as described above, as shown in FIG. 8D, the sealing plate 30 is joined to the silicon wafer 110, and the pressure generating chambers 12 and the like are formed by etching the silicon wafer 110 through the mask film 51 patterned into a predetermined shape. Incidentally, in practice, a large number of chips are simultaneously formed on one silicon wafer 110 by the aforementioned series of film formation and anisotropic etching. After the aforementioned process has been finished, the aforementioned nozzle plate 20 and compliance plate 40 are adhered to the silicon wafer 110 to be integrated therewith. Thereafter, the resultant structure is divided for each passage-forming substrate 10 having a one-chip size as shown in FIG. 1, and thereby formed into ink jet recording heads.

As described above, one embodiment of the present invention has been described. The constitution of the present invention is not limited to one described above. For example, though the fan has been provided as cooling means in the heating apparatus in the above-described embodiment, cooling means may be anything capable of lowering the temperature of the space in the vicinity of the surface of the silicon wafer to a predetermined temperature. Further, though the ink jet recording head has been described as an example in the above-described embodiment, the method of forming the piezoelectric layer of the present invention can also be applied to forming a piezoelectric layer used for other device. Of course, the heating apparatus can also be adopted when a piezoelectric layer of any device is formed.

Moreover, in this embodiment, the ink jet recording head has been illustrated as an example of a device on which a piezoelectric element having a piezoelectric layer is mounted. However, the present invention is also applied to piezoelectric elements mounted on various kinds of liquid jet heads other than an ink jet recording head, e.g., a color material jet head used for manufacturing color filters of a liquid crystal display or the like; an electrode material jet head used for forming electrodes of an organic EL display, a field emission display (FED), or the like; and a bio-organic matter jet head used for manufacturing biochips. Furthermore, it is obvious that the present invention can be also applied not only to piezoelectric elements mounted on liquid jet heads but also to piezoelectric elements mounted on any other devices.

What is claimed is:

1. A method of forming a piezoelectric layer in forming a piezoelectric element including a lower electrode placed on one surface of a substrate, the piezoelectric layer placed on the lower electrode and made of a plurality of ferroelectric films, and an upper electrode placed on the piezoelectric layer, the method comprising:
   a drying step for forming at least one ferroelectric precursor film on the lower electrode of the substrate and drying the ferroelectric precursor film;
   a degreasing step for carrying the substrate into a region facing a hot plate heated to a certain temperature and for degreasing the ferroelectric precursor film in a state where the substrate is supported by a proximity pin; and
   a baking step for further baking the degreased ferroelectric precursor film to form the degreased ferroelectric precursor film into the ferroelectric film,
   wherein the piezoelectric layer is formed by repeating the drying, degreasing, and baking steps for the ferroelectric precursor film in a predetermined number of cycles, and
   the degreasing step includes a step of adjusting a heating temperature of the ferroelectric precursor film by adjusting a distance between the hot plate and the substrate and by lowering a temperature of space on an opposite side of the substrate from the hot plate.

2. The method of forming the piezoelectric layer according to claim 1, wherein the degreasing step for a first cycle comprises:
   a first step for degreasing the ferroelectric precursor film in a state where a predetermined distance is maintained between the substrate and the hot plate; and
   a second step for degreasing the ferroelectric precursor film in a state where the substrate is in contact with the hot plate.

3. The method of forming the piezoelectric layer according to claim 1, wherein the temperature of the space is lowered by generating air flow in a vicinity of a surface of the substrate.

4. The method of forming the piezoelectric layer according to claim 1, wherein the temperature of the space is lowered to 200° C. or less.

5. The method of forming the piezoelectric layer according to claim 4, wherein the hot plate is heated to 300° C. to 500° C.

* * * * *